(12) United States Patent
Adams et al.

(10) Patent No.: US 7,684,263 B2
(45) Date of Patent: Mar. 23, 2010

(54) METHOD AND CIRCUIT FOR IMPLEMENTING ENHANCED SRAM WRITE AND READ PERFORMANCE RING OSCILLATOR

(75) Inventors: Chad Allen Adams, Byron, MN (US); Todd Alan Christensen, Rochester, MN (US); Peter Thomas Freiburger, Rochester, MN (US); Travis Reynold Hebig, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 78 days.

(21) Appl. No.: 12/015,806

(22) Filed: Jan. 17, 2008

(65) Prior Publication Data

US 2009/0185435 A1  Jul. 23, 2009

(51) Int. Cl.
*G11C 7/00* (2006.01)
(52) U.S. Cl. .................. 365/189.14; 365/154; 365/155; 365/156
(58) Field of Classification Search ................. 365/154, 365/155, 156
See application file for complete search history.

(56) References Cited

U.S. PATENT DOCUMENTS

| 7,142,064 | B2 * | 11/2006 | Chan et al. ..................... 331/57 |
| 7,480,170 | B1 * | 1/2009 | Adams et al. ................ 365/154 |
| 7,483,327 | B2 * | 1/2009 | Qureshi et al. .............. 365/226 |
| 7,505,340 | B1 * | 3/2009 | Adams et al. ................ 365/201 |

* cited by examiner

*Primary Examiner*—Connie C Yoha
(74) *Attorney, Agent, or Firm*—Joan Pennington (57) ABSTRACT

A method and circuit for implementing an enhanced static random access memory (SRAM) read and write performance ring oscillator, and a design structure on which the subject circuit resides are provided. A plurality of SRAM base blocks is connected together in a chain. Each of the plurality of SRAM base blocks includes a SRAM cell, such as an eight-transistor (8T) static random access memory (SRAM) cell, and a local evaluation block coupled to the SRAM cell. The SRAM cell includes independent left wordline input and right wordline input. The SRAM cell includes a read wordline connected high, and a true and complement write bitline pair connected low. In the local evaluation circuit, one input of a NAND gate receiving the read bitline input is connected high. A control signal is combined with an inverted feedback signal to start and stop the ring oscillator.

16 Claims, 8 Drawing Sheets

METHOD AND CIRCUIT FOR IMPLEMENTING ENHANCED SRAM WRITE AND READ PERFORMANCE RING OSCILLATOR

FIELD OF THE INVENTION

The present invention relates generally to the data processing field, and more particularly, relates to a method and circuit for implementing an enhanced static random access memory (SRAM) read and write performance sort ring oscillator (PSRO), and a design structure on which the subject circuit resides.

DESCRIPTION OF THE RELATED ART

In advanced CMOS technologies it is becoming common practice for the static random access memory (SRAM) cells to have unique threshold voltage implants independent from standard logic devices. This causes the SRAM cells to loose tracking to the standard logic with conventional SRAM performance sort ring oscillators (PSROs) used as performance monitors or on-device wafer monitors for manufacturing line tuning.

Figure 1A:
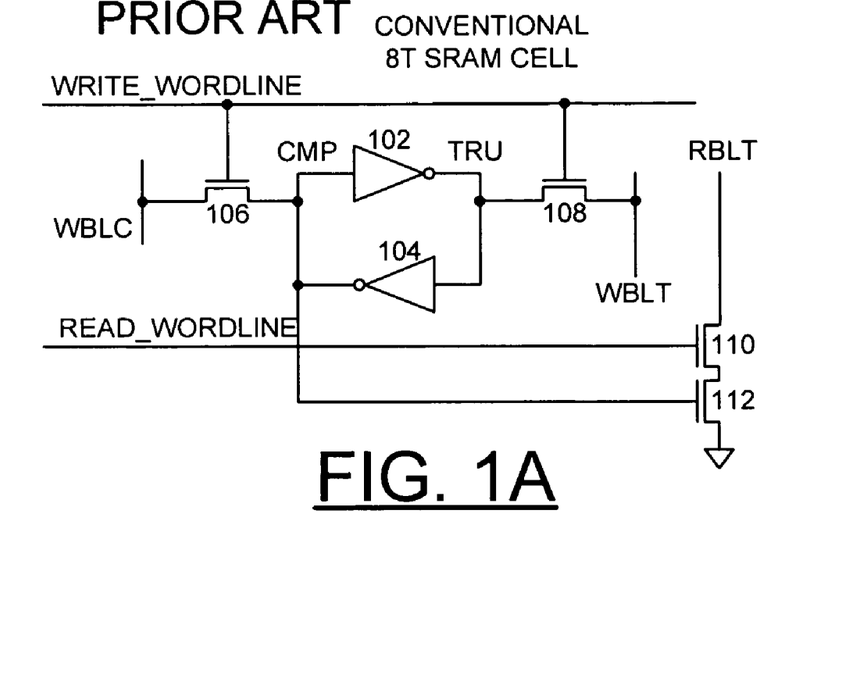
FIG. 1A illustrates a conventional eight-transistor (8T) static random access memory (SRAM) cell.

FIG. 1A illustrates a conventional eight-transistor (8T) static random access memory (SRAM) cell. The prior art 8T SRAM cell includes four transistors defining a pair of parallel reverse polarity connected inverters 102, 104 for storing data, a pair of N-channel field effect transistors (NFETs) 106, 108 respectively connected to a respective side of the static latch and a respective one of a write bit line pair WBLC, WBLT, and receiving a gate input WRITE_WORDLINE that is activated to turn on NFETs 106, 108 to perform a write operation, and a pair of series connected NFETs 110, 112 connected to a read bitline RBLT with NFET 110 receiving a gate input READ_WORDLINE, and NFET 112 receiving a gate input connected to a first side or complement side (CMP) of the static latch, as shown in FIG. 1A. NFET 110 is activated by the gate input READ_WORDLINE to perform a read operation.

U.S. patent application Ser. No. 11/782,808 filed Jul. 25, 2007 by Chad Allen Adams, Todd Alan Christensen, Travis Reynold Hebig, and Kirk David Peterson, discloses a method and apparatus for implementing an enhanced SRAM read performance sort ring oscillator (PSRO). A pair of parallel reverse polarity connected inverters defines a static latch or cross-coupled memory cell. The SRAM cell includes independent left and right wordlines providing a respective gate input to a pair of access transistors used to access to the memory cell. The SRAM cell includes a voltage supply connection to one side of the static latch. For example, a complement side of the static latch is connected to the voltage supply. A plurality of the SRAM cells is assembled together to form a SRAM base block. A plurality of the SRAM base blocks is connected together to form the SRAM read PSRO.

The above identified patent application provides an improved effective method and apparatus for implementing an enhanced six-transistor (6T) SRAM read performance sort ring oscillator (PSRO). The frequency of this prior art 6T SRAM PSRO is a function of only read performance and not write performance.

A need exists for an enhanced static random access memory (SRAM) read and write performance sort ring oscillator to monitor write performance in addition to read performance.

SUMMARY OF THE INVENTION

Principal aspects of the present invention are to provide a method and circuit for implementing an enhanced static random access memory (SRAM) write and read performance ring oscillator. Other important aspects of the present invention are to provide such method and circuit for implementing an enhanced static random access memory (SRAM) write and read performance ring oscillator substantially without negative effect and that overcome many of the disadvantages of prior art arrangements.

In brief, a method and circuit for implementing an enhanced static random access memory (SRAM) read and write performance ring oscillator, and a design structure on which the subject circuit resides are provided. A plurality of SRAM base blocks is connected together in a chain. Each of the plurality of SRAM base blocks includes a SRAM cell and a local evaluation block coupled to the SRAM cell. The SRAM cell includes independent left wordline input and right wordline input. Each of the plurality of SRAM base blocks receive a wordline input and a reset input and providing a wordline output. The SRAM cell performs a write operation and a read operation responsive to the received wordline input; and the local evaluation block provides the wordline output responsive to the write operation and the read operation. The reset signal is applied in parallel to each of the plurality of SRAM base blocks. The wordline output of the SRAM base blocks goes high and is applied to the wordline input of a next one of the SRAM base blocks in the chain. The wordline output of a last one of the plurality of SRAM base blocks in the chain provides a feedback signal coupled to the wordline input of a first one of the plurality of SRAM base blocks. The feedback signal is coupled to a ring oscillator output path.

In accordance with features of the invention, the SRAM cell includes an eight-transistor (8T) static random access memory (SRAM) cell. The SRAM cell includes a read wordline connected high, and the true write bitline WBLT and WBLC connected low. In the local evaluation circuit, one input of a NAND gate receiving the read bitline input is connected high. A control signal is combined with an inverted feedback signal to start and stop the ring oscillator.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In accordance with features of the invention, a slightly modified eight-transistor (8T) static random access memory (SRAM) cell is assembled together with a domino sense circuit to create a 8T SRAM performance sort ring oscillator (PSRO) that directly tracks the performance of 8T SRAM macros much closer than standard logic PSROs. One important feature of this invention is that write time and read time are both part of the oscillation frequency.

Figure 1B:
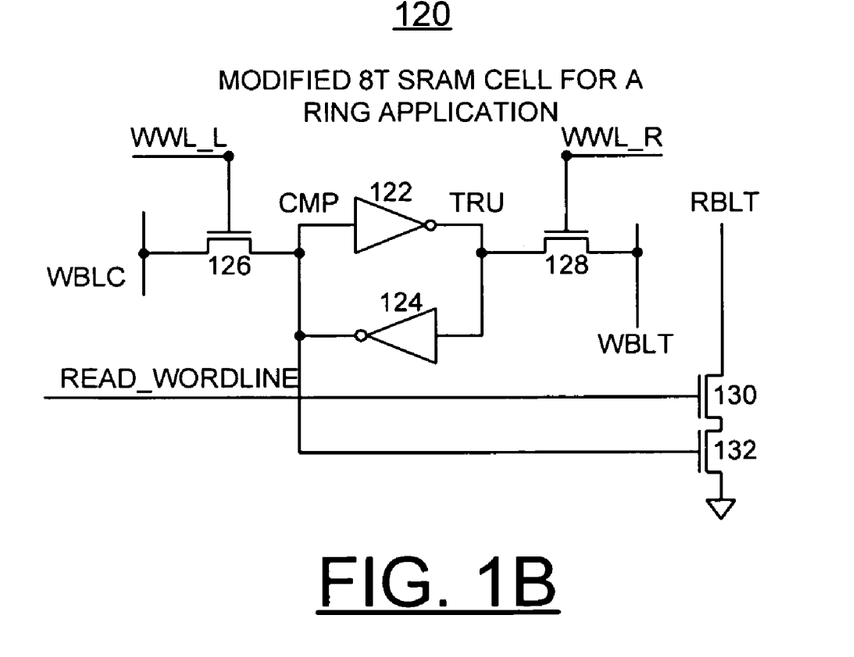
FIG. 1B illustrates an exemplary modified eight-transistor (8T) static random access memory (SRAM) cell for implementing a write and read performance sort ring oscillator (PSRO) in accordance with the preferred embodiment.

Having reference now to the drawings, in FIG. 1B, there is shown modified eight-transistor (8T) static random access memory (SRAM) cell generally designated by the reference character 120 for implementing a SRAM read and write performance sort ring oscillator (PSRO) in accordance with the preferred embodiment.

SRAM cell 120 includes a static latch or cross-coupled memory cell defined by a pair of parallel reverse-connected inverters 122, 124 for storing data and a pair of N-channel field effect transistors (NFETs) 126, 128 respectively connected to a respective side of the static latch. The inverters 122, 124 defining the static latch include four transistors (not shown).

SRAM cell 120 of the preferred embodiment includes independent left and right write wordlines WWL_L (WRITE WORDLINE LEFT), WWR_R (WRITE WORDLINE RIGHT) providing a respective gate input to the access transistors 126, 128 used to obtain access to the memory cell. The pair of access NFETs 126, 128 is connected between a respective first side or complement side (CMP) of the static latch and a complement write bitline input WBLC and a second side or true side of the static latch of the parallel reverse-connected inverters 122, 124 and a true write bitline WBLT. NFETs 126, 128 receive the respective gate input WWL_L (WRITE WORDLINE LEFT), WWL_R (WRITE WORDLINE RIGHT) that is activated, turning on the respective NFETs 126, 128.

SRAM cell 120 includes a pair of series connected NFETs 130, 132 connected to a read bitline RBLT with NFET 130 receiving a gate input READ_WORDLINE, and NFET 132 receiving a gate input connected to the first side or complement side (CMP) of the static latch. NFET 130 is activated by the gate input READ_WORDLINE to perform a read operation.

Figure 2:
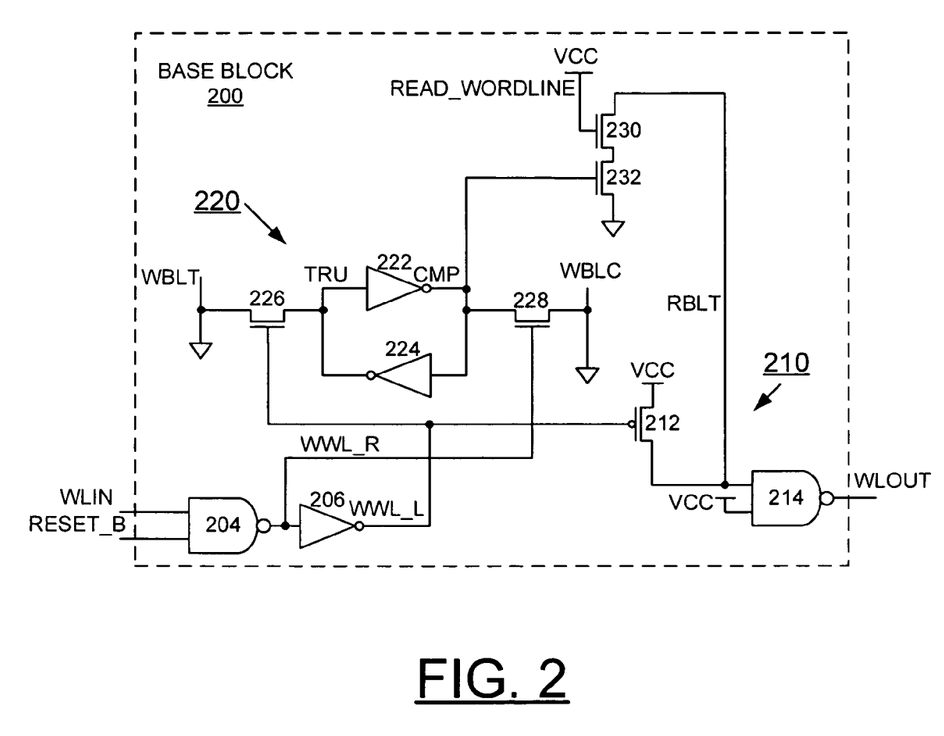
FIG. 2 illustrates an exemplary SRAM base block used for implementing a write and read performance sort ring oscillator (PSRO) in accordance with the preferred embodiment.

FIG. 2 illustrates an exemplary SRAM base block generally designated by the reference character 200 used for implementing a write and read performance sort ring oscillator (PSRO) in accordance with the preferred embodiment.

SRAM base block 200 includes an input NAND gate 204 receiving a wordline input WLIN and a reset signal input RESET_B providing an output of a gate input WWL_R (WRITE WORDLINE RIGHT). The output of NAND gate 204 is applied to an inverter 206 providing an inverted output of a gate input WWL_L (WRITE WORDLINE LEFT). SRAM base block 200 includes a local evaluation circuit generally designated by the reference character 210. The local evaluation circuit 21 0 includes a P-channel field effect transistor (PFET) 212 and a two-input NAND gate 214. PFET 212 is connected between a voltage supply VCC and a first input of NAND gate 214 receiving a gate input of WWL_L (WRITE WORDLINE LEFT) output of inverter 206.

SRAM base block 200 includes a modified SRAM cell 220, which is a modified eight-transistor (8T) static random access memory (SRAM) cell, such as 8T SRAM cell 120. SRAM cell 220 includes a pair of parallel reverse-connected inverters 222, 224 for storing data and a pair of N-channel field effect transistors (NFETs) 226, 228 respectively connected to a respective side CMP, TRU of the static latch and a respective one of a write bit line pair WBLT, WBLC, and having a respective gate input of WWL_L (WRITE WORDLINE LEFT), and WWL_R (WRITE WORDLINE RIGHT). SRAM cell 220 includes a pair of series connected NFETs 230, 232 connected to a read bitline RBLT. The NFET 230 receives a gate input READ_WORDLINE connected to the voltage supply VCC, and NFET 232 receiving a gate input connected to the complement side (CMP) of the static latch.

In accordance with features of the invention, SRAM base block 200 is implemented with the modified SRAM cell 220 having the READ_WORDLINE including a high connection or connection to the voltage supply VCC and the true and complement write bitline inputs WBLT and WBLC including a low connection or connection to ground potential. With these connections, no initialization of the SRAM cell 220 is required.

One input of the NAND gate 214 in local evaluation circuit 220 is a high connection or connection to the voltage supply VCC. The second input of the NAND gate 214 is the read bitline RBLT connected to the NFET 230 of SRAM cell 220. The NAND gate 214 provides an output WLOUT of the SRAM base block 200. It should be understood that an inverter having an input connected to the read bitline RBLT could be used instead of the NAND gate 214.

While the SRAM base block 200 is shown with a single modified SRAM cell 220, it should be understood that multiple dummy SRAM cells can be connected to the same write bit line pair WBLT, WBLC and read bitline RBLT.

Figure 3:
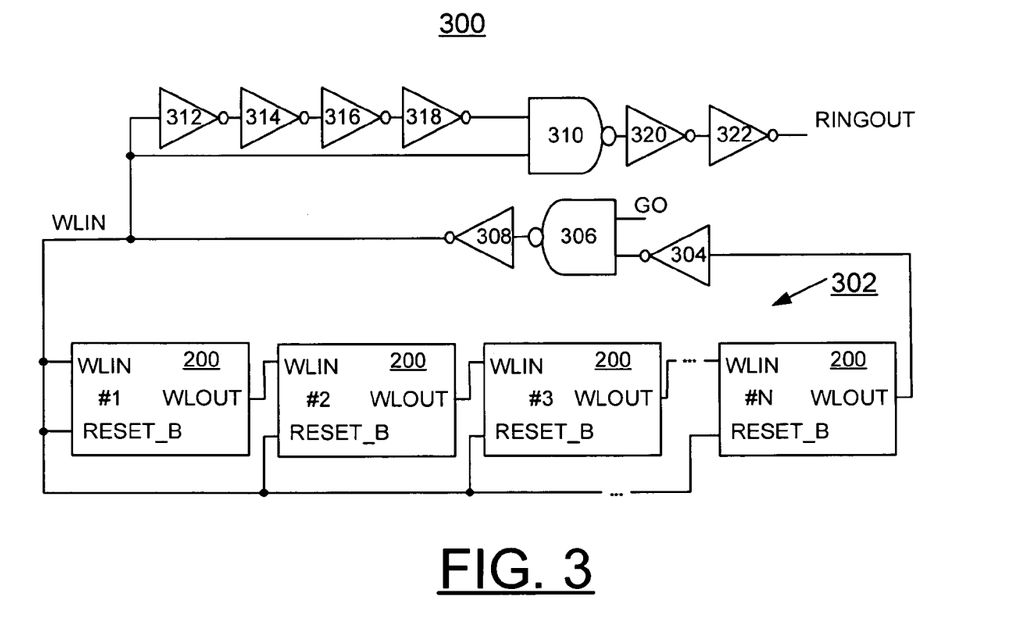
FIG. 3 illustrates an exemplary SRAM write and read performance sort ring oscillator (PSRO) in accordance with the preferred embodiment.

Referring now to FIG. 3, there is shown an exemplary SRAM write and read performance sort ring oscillator (PSRO) generally designated by the reference character 300 in accordance with the preferred embodiment.

SRAM write and read PSRO 300 includes a chain 302 of a plurality of SRAM base blocks 200, #1-N connected together in a chain as illustrated. The RESET signal is brought into all SRAM base blocks 200, #1-N in parallel. The output WLOUT of SRAM base blocks 200 #1-(N−1) is connected to the input WLIN in the next SRAM base block 200 #2-N. The output WLOUT of SRAM base block 200 #N is coupled to the input WLIN in the SRAM base block 200 #1 through the illustrated logic gates.

SRAM write and read PSRO 300 provides a ring oscillator output signal RINGOUT. As shown, the wordline input WLIN is applied to the first SRAM base block 200, #1 and the output WLOUT of the SRAM base block 200, #N provides a feedback signal applied to an inverter 304 providing an inverted feedback signal applied to a NAND gate 306. The inverted feedback signal is combined with a control signal GO by NAND gate 306. The NAND gate 306 is used to stop and start the ring operation. The GO signal of the feedback two input NAND gate 306 stops the ring operation when low and allows the ring to run when high. The output of NAND gate 306 is applied to an inverter 308 providing an inverted controlled feedback signal applied to a NAND gate 310 and coupled to the input WLIN in the SRAM base block 200 #1. Since the operation is a series write and read but parallel reset the output RINGOUT of the SRAM PSRO 300 is a short pulse. A plurality of inverters 312, 314, 316, 318 optionally is included in a ring output path to a second input to NAND gate 310 to expand the pulse width of the ring oscillator output signal RINGOUT for sending across an associated chip. A final pair of inverters 320, 322 optionally is connected to the output of NAND gate 310 for providing the ring oscillator output signal RINGOUT.

The RESET signal is applied in parallel to each of the plurality of the SRAM base blocks 200 so that the period of the ring oscillator output signal RINGOUT is a function of many series write and read operations but only a single reset time.

The operation of the SRAM base block 200 illustrated in FIG. 2 and used in SRAM write and read PSRO 300 may be understood as follows:

1) The RESET_B signal starts high with WLIN low, applied to the input NAND gate 204.

2) While RESET_B is still high, WLIN goes high causing the output WWL_R of NAND gate 204 to go low and the output WWL_L of inverter 206 to go high. This causes a 0 to be written to the TRU side of the SRAM cell 220 and causes CMP side of the SRAM cell 220 to go high. Then, the read bitline RBLT goes low and the SRAM cell 220 is read by the local evaluation circuit 210 with the output WLOUT of NAND gate 214 then goes high. The output WLOUT of NAND gate 214 is applied to the input WLIN in the next SRAM base block 200, and the same operation is repeated.

3) The RESET_B signal is used after this writing and reading of the 8T SRAM cell 200 has propagated through all of the base blocks 200 #1-#N as illustrated in FIG. 3. The feedback is inverted to reset all the 8T SRAM cells in parallel. During this reset, RESET_B goes low causing WWL_R to go high and WWL_L to go low. This writes a 0 to the CMP side of the SRAM cell 220 and causes the TRU side of the SRAM cell 220 to go high.

Referring also to FIGS. 4, 5, 6, and 7, there are shown waveforms illustrating the operation of the exemplary SRAM write and read performance sort ring oscillator (PSRO) 300 in accordance with the preferred embodiment.

Figure 4:
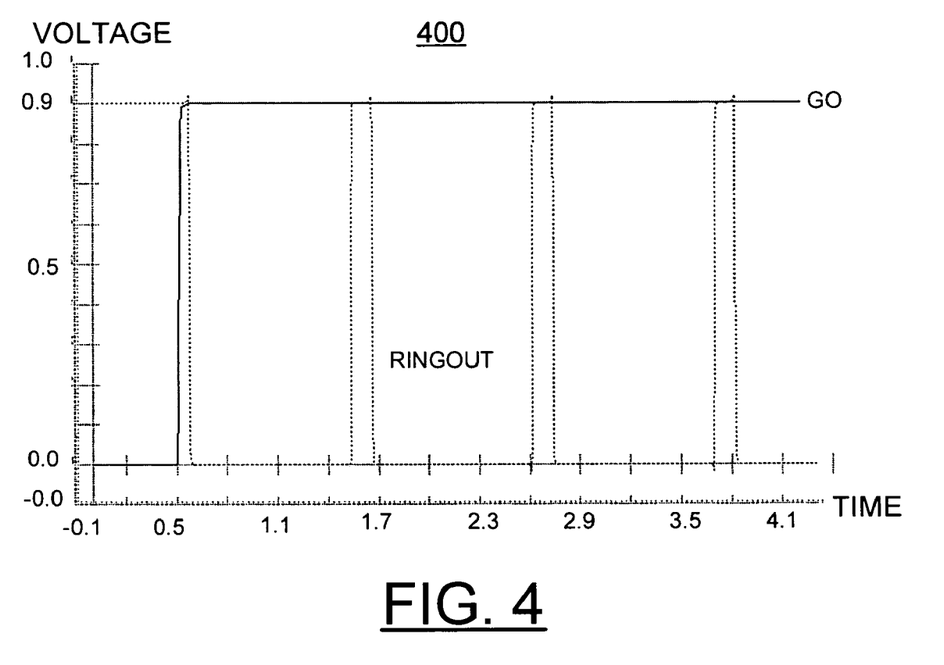
FIGS. 4, 5, 6, and 7 are charts illustrating operation of the exemplary SRAM write and read performance sort ring oscillator (PSRO) of FIG. 3 in accordance with the preferred embodiment.

FIG. 4 shows the simulated top level waveforms of the SRAM write and read PSRO 300. When the GO control signal goes high enabling the ring operation, the ring oscillator output signal RINGOUT produces a series of repeated pulses where the period is determined by the combination of the series write and read operations and single reset operation per pulse.

Figure 5:
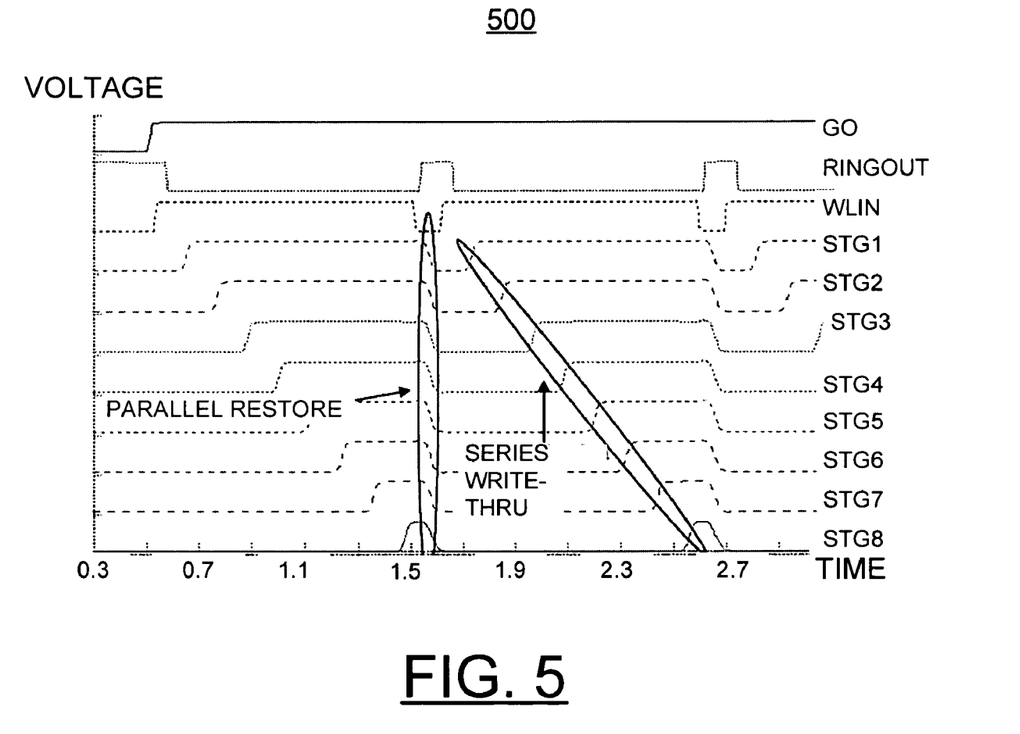

FIG. 5 shows the simulated waveforms of the top level nets between the base SRAM building blocks 200 of the SRAM write and read PSRO 300. Eight base SRAM blocks 200 were used in the embodiment of the circuit simulated to generate the waveforms of FIG. 5. FIG. 5 illustrates exemplary illustrated waveforms WLOUT coupled between the base building blocks 200 and labeled STG1-STG8 with an input waveform WLIN applied to the first block 200, #1. FIG. 5 shows how the reset is done in parallel with each RINGOUT pulse and labeled PARALLEL RESTORE and the following series nature of the write and read operations labeled SERIES WRITE-THRU.

Figure 6:
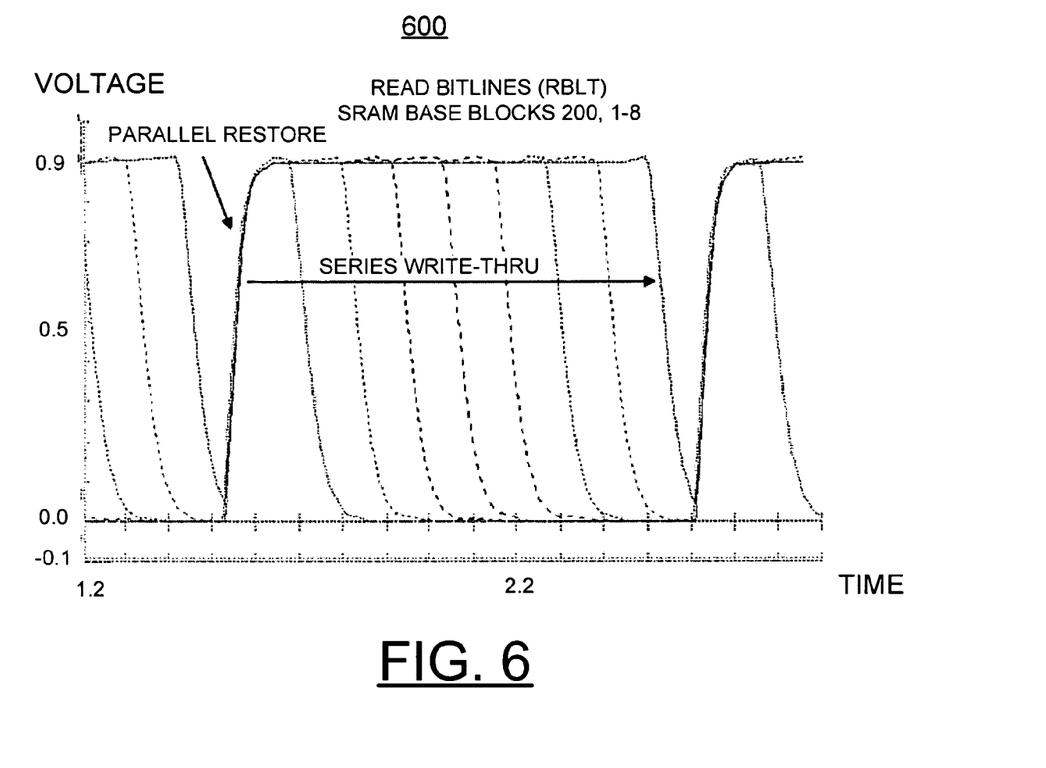

FIG. 6 shows the simulated waveforms of the internal read bitlines (RBLT) inside the base SRAM building blocks 200 of the SRAM write and read PSRO 300. FIG. 6 illustrates the parallel reset of the entire ring oscillator 300 labeled PARALLEL RESTORE and the series nature of the write and read operations labeled SERIES WRITE-THRU.

Figure 7:
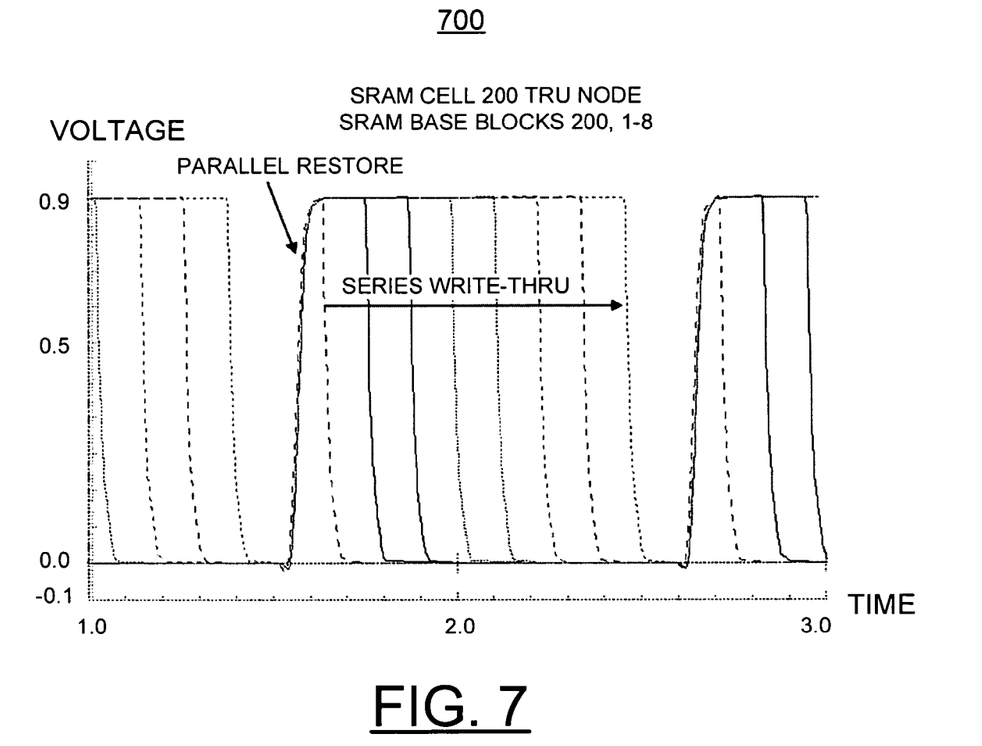

FIG. 7 shows the simulated waveforms of the internal true node TRU of the 8T SRAM cells 220 inside the base SRAM building blocks 200 of the SRAM write and read PSRO 300. FIG. 7 illustrates the parallel reset of the entire ring oscillator 300 labeled PARALLEL RESTORE and the series nature of the write and read operations labeled SERIES WRITE-THRU.

Figure 8:
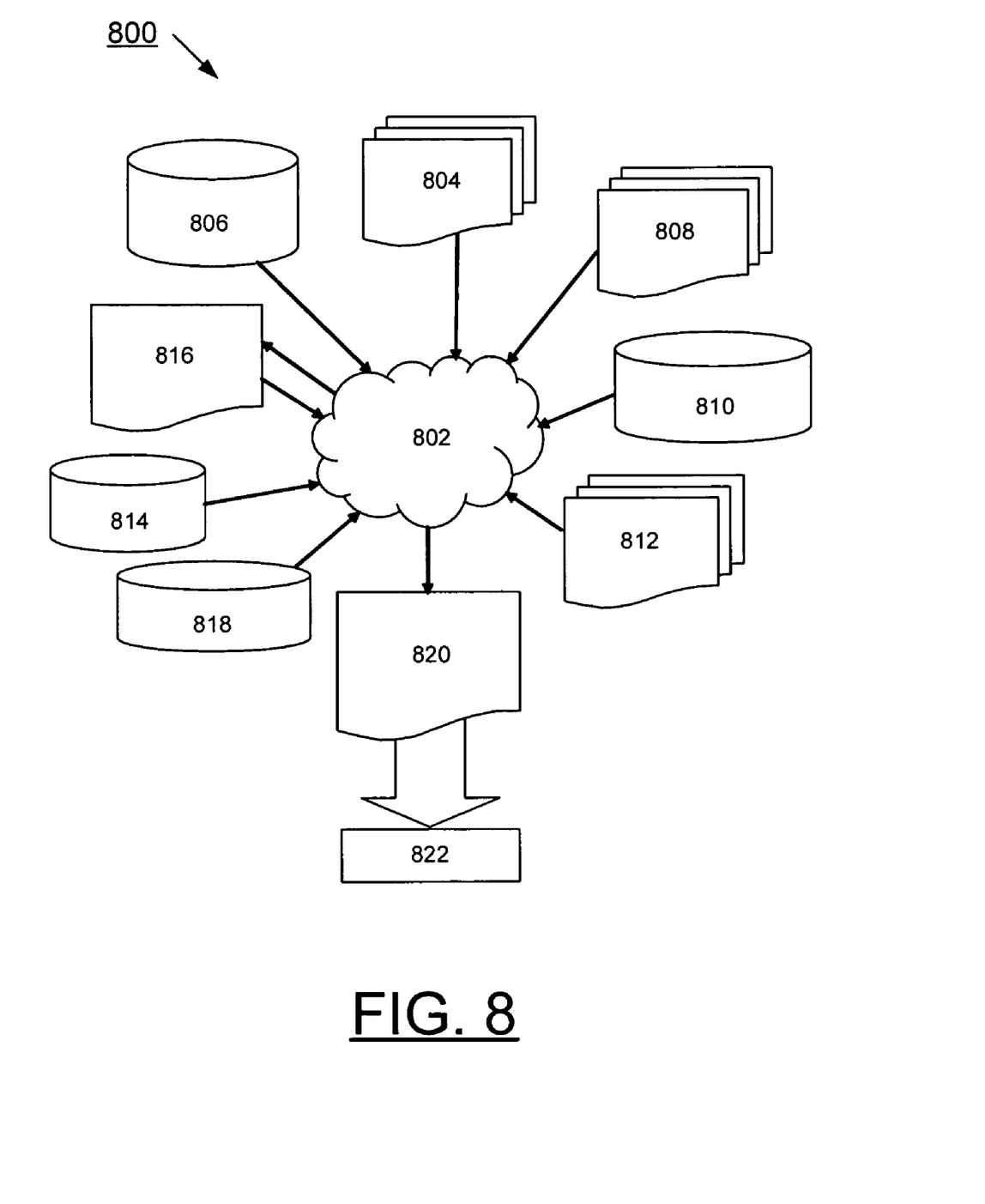
FIG. 8 is a flow diagram of a design process used in semiconductor design, manufacturing, and/or test.

FIG. 8 shows a block diagram of an example design flow 800. Design flow 800 may vary depending on the type of IC being designed. For example, a design flow 800 for building an application specific IC (ASIC) may differ from a design flow 800 for designing a standard component. Design structure 802 is preferably an input to a design process 804 and may come from an IP provider, a core developer, or other design company or may be generated by the operator of the design flow, or from other sources. Design structure 802 comprises circuits 120, 200, 300 in the form of schematics or HDL, a hardware-description language, for example, Verilog, VHDL, C, and the like. Design structure 802 may be contained on one or more machine readable medium. For example, design structure 802 may be a text file or a graphical representation of circuits 120, 200, 300. Design process 804 preferably synthesizes, or translates, circuits 120, 200, 300 into a netlist 806, where netlist 806 is, for example, a list of wires, transistors, logic gates, control circuits, I/O, models, etc. that describes the connections to other elements and circuits in an integrated circuit design and recorded on at least one of machine readable medium. This may be an iterative process in which netlist 806 is resynthesized one or more times depending on design specifications and parameters for the circuits.

Design process 804 may include using a variety of inputs; for example, inputs from library elements 808 which may house a set of commonly used elements, circuits, and devices, including models, layouts, and symbolic representations, for a given manufacturing technology, such as different technology nodes, 32 nm, 45 nm, 90 nm, and the like, design specifications 810, characterization data 812, verification data 814, design rules 816, and test data files 818, which may include test patterns and other testing information. Design process 804 may further include, for example, standard circuit design processes such as timing analysis, verification, design rule checking, place and route operations, and the like. One of ordinary skill in the art of integrated circuit design can appreciate the extent of possible electronic design automation tools and applications used in design process 804 without deviating from the scope and spirit of the invention. The design structure of the invention is not limited to any specific design flow.

Design process 804 preferably translates an embodiment of the invention as shown in FIGS. 1B, 2, and 3 along with any additional integrated circuit design or data (if applicable), into a second design structure 820. Design structure 820 resides on a storage medium in a data format used for the exchange of layout data of integrated circuits, for example, information stored in a GDSII (GDS2), GL1, OASIS, or any other suitable format for storing such design structures. Design structure 820 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1B, 2, and 3. Design structure 820 may then proceed to a stage 822 where, for example, design structure 820 proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. A circuit for implementing an enhanced static random access memory (SRAM) write and read performance sort ring oscillator (PSRO) comprising:
    a plurality of SRAM base blocks connected together in a chain,
    each of said plurality of SRAM base blocks including a SRAM cell and a local evaluation block coupled to said SRAM cell; said SRAM cell including independent left wordline input and right wordline input;
    said SRAM cell includes an eight-transistor (8T) static random access memory (SRAM) cell and said 8T SRAM cell includes a static latch defined by a pair of parallel reverse polarity connected inverters;
    each of said plurality of SRAM base blocks receiving a wordline input and a reset input and providing a wordline output;
    said SRAM cell performing a write operation and a read operation responsive to said received wordline input; and said local evaluation block providing said wordline output responsive to said write operation and said read operation;
    said reset signal being applied in parallel to each of said plurality of SRAM base blocks;
    each of said plurality of SRAM base blocks includes a NAND gate receiving said wordline input and said reset signal,
    said wordline output of said SRAM base blocks being applied to said wordline input of a next one of said SRAM base blocks in said chain, and said wordline output of a last one of said plurality of SRAM base blocks in said chain providing a feedback signal coupled to said wordline input of a first one of said plurality of SRAM base blocks; and
    said feedback signal coupled to a ring oscillator output path.

2. The circuit as recited in claim 1 wherein said 8T SRAM cell includes a pair of access N-channel field effect transistors (NFETs) respectively connected between a first side and a second side of said static latch and a respective write bitline input, each said respective write bitline input connected to ground potential and said independent left wordline input and right wordline input applied to a respective gate input of said access NFETs.

3. The circuit as recited in claim 2 wherein said independent left wordline input and said right wordline input applied to a respective gate input of said access NFETs include a combined signal of said wordline input and said reset signal and an inverted combined signal.

4. The circuit as recited in claim 2 wherein said 8T SRAM cell includes a pair of series connected N-channel field effect transistors (NFETs) connected to a read bitline RBLT and having a respective gate input connected to a read wordline and said second side of said static latch; said read wordline connected to a voltage supply rail.

5. The circuit as recited in claim 1 wherein said evaluation circuit includes a NAND gate receiving a first input of a read bitline RBLT, and a second input connected to a voltage supply, and said NAND gate providing said wordline output of each of said SRAM base blocks.

6. The circuit as recited in claim 5 wherein said evaluation circuit a precharge transistor connected between the voltage supply and the read bitline RBLT, and said precharge transistor having a gate input connection to said left wordline input WLL.

7. The circuit as recited in claim 1 wherein said ring oscillator output path includes a NAND gate receiving an inverted feedback signal and a control signal to stop and start ring operation.

8. The circuit as recited in claim 7 wherein said ring oscillator output path includes a plurality of series connected inverters to expand a pulse width of a ring oscillator output signal.

9. A method for implementing an enhanced static random access memory (SRAM) read and write performance ring oscillator comprising:
    providing a SRAM base blocks including a SRAM cell and a local evaluation block coupled to said SRAM cell; said local evaluation block providing a wordline output;
    providing an eight-transistor (8T) static random access memory (SRAM) cell for said SRAM cell;
    providing said SRAM cell with independent left wordline input and right wordline input;
    connecting a plurality of SRAM base blocks together in a chain, applying said wordline output of said SRAM base blocks to a wordline input of a next one of said SRAM base blocks in said chain, and applying a feedback signal of said wordline output of a last one of said plurality of SRAM base blocks in said chain to said wordline input of a first one of said plurality of SRAM base blocks in said chain;
    providing said feedback signal to a ring oscillator output path;
    applying a reset input in parallel to each of said plurality of SRAM base blocks receiving and;
    performing a write operation and a read operation with said SRAM cell responsive to said received wordline input; and said local evaluation block providing said wordline output responsive to said write operation and said read operation.

10. The method as recited in claim 9 includes providing each of said plurality of SRAM base blocks with a NAND gate receiving said wordline input and said reset signal.

11. The method as recited in claim 9 includes providing a read wordline connected high, and a true write bitline and a complement write bitline connected low in said SRAM cell.

12. The method as recited in claim 9 includes providing one input of a NAND gate receiving the read bitline input connected high in the local evaluation circuit.

13. A design structure embodied in a machine readable medium used in a design process, the design structure comprising:
    a plurality of SRAM base blocks connected together in a chain,
    each of said plurality of SRAM base blocks including a SRAM cell and a local evaluation block coupled to said SRAM cell; said SRAM cell including independent left wordline input and right wordline input;
    each of said plurality of SRAM base blocks receiving a wordline input and a reset input and providing a wordline output;
    said SRAM cell performing a write operation and a read operation responsive to said received wordline input; and said local evaluation block providing said wordline output responsive to said write operation and said read operation;
    said reset signal being applied in parallel to each of said plurality of SRAM base blocks;
    said wordline output of said SRAM base blocks being applied to said wordline input of a next one of said SRAM base blocks in said chain, and said wordline output of a last one of said plurality of SRAM base blocks in said chain providing a feedback signal coupled to said wordline input of a first one of said plurality of SRAM base blocks;

said feedback signal coupled to a ring oscillator output path;

wherein the SRAM cell includes an eight-transistor (8T) static random access memory (SRAM) cell, the SRAM cell includes providing a read wordline connected high, and a true write bitline and a complement write bitline connected low in said SRAM cell.

14. The design structure of claim 13, wherein the design structure comprises a netlist, which describes the circuit.

15. The design structure of claim 13, wherein the design structure resides on storage medium as a data format used for the exchange of layout data of integrated circuits.

16. The design structure of claim 13, wherein the design structure includes at least one of test data files, characterization data, verification data, or design specifications.

* * * * *